(12) United States Patent
Bar-Niv

(10) Patent No.: US 6,442,142 B1
(45) Date of Patent: Aug. 27, 2002

(54) BASE-BAND RECEIVER ENERGY DETECTION SYSTEM

(75) Inventor: Amir Bar-Niv, Ramat Gan (IL)

(73) Assignee: Mysticom Ltd., Netanya (IL)

( * ) Notice: Subject to any disclaimer, the term of this patent is extended or adjusted under 35 U.S.C. 154(b) by 0 days.

(21) Appl. No.: 09/265,781

(22) Filed: Mar. 10, 1999

(51) Int. Cl.[7] .............................................. H04L 12/26
(52) U.S. Cl. ........................ 370/252; 370/241; 713/300
(58) Field of Search .............................. 370/252, 241, 370/245, 253, 311, 450, 433, 232, 908, 910; 713/300, 320, 324

(56) References Cited

U.S. PATENT DOCUMENTS 5,907,553 A * 5/1999 Kelly et al. .................. 370/433
5,946,301 A * 8/1999 Swanson et al. ............. 370/252
6,026,494 A * 2/2000 Foster .......................... 713/320
6,169,475 B1 * 1/2001 Browning .............. 340/286.02

* cited by examiner

*Primary Examiner*—Dang Ton
*Assistant Examiner*—Brian Nguyen
(74) *Attorney, Agent, or Firm*—Ladas & Parry

(57) ABSTRACT

A method for determining whether signal data exists on a communication line, including: receiving a signal from the line; measuring a level of the received signal at a plurality of predetermined times; comparing the measured levels with predetermined reference levels so as to identify a plurality of valid data pulses; measuring a time interval between two or more of the valid data pulses; and determining that the valid pulses represent signal data responsive to the measured time interval.

10 Claims, 4 Drawing Sheets

BASE-BAND RECEIVER ENERGY DETECTION SYSTEM

FIELD OF THE INVENTION

The present invention relates generally to communications devices, and specifically to reduction of power consumption by digital communications transceivers.

BACKGROUND OF THE INVENTION

The advantage of automatically reducing the power consumption of electronic devices when they are in a link-off state is well known in the art. As devices decrease in size, and the number of devices in the system increases, the importance of power reduction increases, in order to reduce the overall power consumption of the system. This is particularly important in environments where the system is battery-powered.

Local-area networks (LANs) and communication devices transmitting and receiving digital signals commonly operate on standards such as Ethernet 10BASE-T, 100BASE-TX or 100BASE-FX. The 10BASE-T Ethernet standard enables communication at 10 Mb/s using Manchester encoding. The 100BASE-TX standard enables communication at 100 Mb/s using MLT-3 encoding. Manchester encoding and MLT-3 encoding involve transmitting both positive- and negative-going pulses on AC-coupled lines. The 100BASE-FX standard enables communication at 100 Mb/s, using external transceiver devices that transmit to and receive from fiber media.

IEEE specification 802.3, which is incorporated herein by reference, delineates the properties of link pulses. The specification also contains a definition of an autonegotiation mechanism for Ethernet transceivers. When the autonegotiation mechanism is enabled, the mode of operation of an Ethernet transceiver may be automatically switched between 100BASE-TX and 10BASE-T modes, as well as between full- and half-duplex modes.

Adhoc Technologies, Inc., of San Jose, Calif., produces the Trex AH101 device, which is an Ethernet transceiver having a power saving and/or a power down mode. The device may be configured to enter the power saving mode automatically when no signals are sensed on an Ethernet communications line to which it is coupled. The device returns to a normal mode, in which it receives signals, when it detects signal energy on a communications line, or receives a valid signal.

SUMMARY OF THE INVENTION

It is an object of some aspects of the present invention to provide a method and apparatus for automatic detection of valid signal data in a communications device.

It is a further object of some aspects of the present invention to provide a method and apparatus for automatic power switching of a communications device.

In some preferred embodiments of the present invention, a signal energy detection system for use in a communications device comprises a digital filter, which analyzes incoming pulses at a plurality of times to make an initial determination of signal energy on a communications line, typically a communication line wherein an Ethernet standard transmission is present. The initial determination is further analyzed in a signal validation machine, which checks a time interval between consecutive signals found in the initial determination, in order to make a more accurate final determination of the presence of valid signal energy on the communications line. The final determination is preferably used to control automatic power switching of the device. The use of the digital filter to make an initial analysis of the incoming pulses, together with the use of the signal validation machine to make a more accurate analysis, enables valid signal pulses to be detected and reduces the chance of a non-valid pulse being assumed to be valid, in a significantly simpler system than is at present known in the art.

The digital filter receives incoming digital pulses, preferably generated by a squelch circuit responsive to the line energy, and checks if respective levels of the pulses at a plurality of preset times, most preferably two times, are above respective predetermined values. If both the levels are above the predetermined values, the filter makes an initial assumption that signal energy is present in the communication line, and sets an output level high.

Preferably, the high output level from the digital filter is transferred to the signal validation machine, which preferably comprises a finite state machine, wherein further analysis of the signal characteristics is made in order to determine if the line energy comprises a valid signal. The signal validation state machine checks the time between consecutive transitions to a high level. If the time between consecutive transitions is within a preset interval, wherein the preset interval is most preferably a function of the clock rate and the temporal separation of sequential idle pulses of the incoming signals, the state machine sets a signal-valid level high indicating that signal energy is present in the communication line. Because a signal-valid level is set high only on receipt of two consecutive transitions within the preset time interval, the output of spurious signal-valid levels is significantly reduced.

The signal-valid level is preferably input to an energy-on signal generator state machine. The energy-on state machine makes a decision when to power-down the device. Its operation depends on an autonegotiation-mode of operation of the device. If the device is in an autonegotiation-enabled mode, then the energy-on state machine monitors the state of an autonegotiation state machine and operates accordingly. If the device is in an autonegotiation-disabled mode, then the energy-on state machine monitors a link state and operates accordingly. A power module of the communications device receives the energy-on signal and, responsive thereto, supplies power to operate modules of the device other than those comprised in the energy detection system. In the event that during a preset time interval the power module determines that the energy-on level is not set high, the power module automatically powers-down the other modules of the transceiver. The modules remain in a powered-down state until the energy-on level is set high again.

There is therefore provided, in accordance with a preferred embodiment of the present invention, a method for determining whether signal data exists on a communication line, including:

receiving a signal from the line;

measuring a level of the received signal at a plurality of predetermined times;

comparing the measured levels with predetermined reference levels so as to identify a plurality of valid data pulses;

measuring a time interval between two or more of the valid data pulses; and determining that the valid pulses represent signal data responsive to the measured time interval.

Preferably, the method includes switching power to a communication device responsive to the existence of the signal data.

Preferably, switching power to the communication device includes utilizing a state machine to switch the power.

Preferably, receiving the signal data includes selecting a communications standard for use, and comparing the measured levels includes comparing the levels at times determined responsive to selection of the standard.

Alternatively, selecting the standard includes selecting an Ethernet standard.

Alternatively, measuring the time interval between valid pulses includes comparing the time interval with times determined responsive to the standard.

Preferably, comparing the measured levels includes comparing the levels to predetermined positive and negative voltage levels.

Preferably, comparing the measured levels includes comparing the levels at times determined by a transition of a clock signal.

There is further provided, in accordance with a preferred embodiment of the present invention, apparatus for evaluating signals on a communication line, including:

a filter which compares a level of the signals measured at a plurality of predetermined times with predetermined reference levels, and responsive to the comparison, outputs an indication as to whether the signals represent valid data pulses; and a signal validation machine which receives the indication and responsive thereto compares a time interval between valid pulses with a predetermined reference time interval so as to determine whether the valid pulses comprise signal data.

Preferably, the apparatus includes a power switch which switches power to a communication device responsive to the existence of the signal data.

Alternatively, the power switch includes a state machine.

Preferably, the signal data is transmitted according to a communications standard, and the filter compares the levels at times determined responsive to the standard.

Alternatively, the standard includes an Ethernet standard.

Preferably, the predetermined reference time interval is determined responsive to the standard.

Preferably, the filter includes a plurality of voltage comparators comparing the level of the signals to predetermined positive and negative voltage levels.

Preferably, the filter includes a clock for determining the times of comparison.

The present invention will be more fully understood from the following detailed description of the preferred embodiments thereof, taken together with the drawings in which:

DETAILED DESCRIPTION OF PREFERRED EMBODIMENTS

Figure 1:
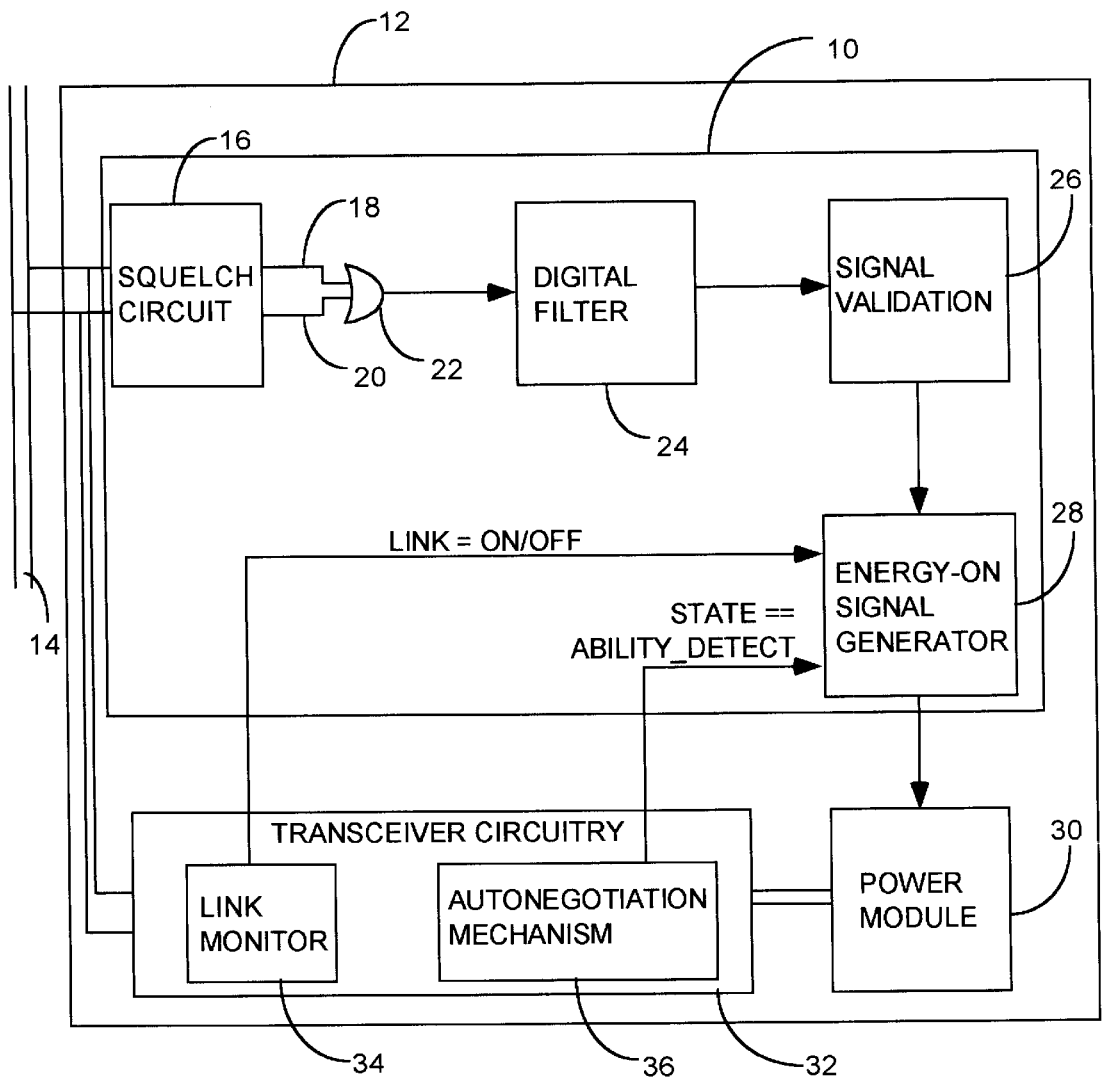
FIG. 1 is a schematic block diagram of a transceiver comprising a signal energy detection system, in accordance with a preferred embodiment of the present invention.

Reference is now made to FIG. 1, which is a schematic block diagram of a transceiver 12 comprising an signal energy detection system 10, according to a preferred embodiment of the present invention. Components of transceiver 12 are most preferably constructed on one integrated circuit die, by methods known in the art. Alternatively, components of transceiver 12 comprise discrete devices.

Energy detection system 10 comprises a squelch circuit 16, which is connected directly to a communication line 14 external to transceiver 12, and which monitors the voltage on line 14. The operation of circuit 16 is described in detail hereinbelow. Most preferably, voltages on line 14 are created by communication signals generated and transmitted according to one of the Ethernet protocols known in the art. Energy detection system 10 utilizes a plurality of signal outputs from circuit 16 in order to generate a control output to power-up a power module 30. Power module 30 supplies power to transceiver circuitry 32.

Transceiver circuitry 32 comprises, inter alia, a link monitor 34, and an autonegotiation mechanism 36. The autonegotiation mechanism selects an operating mode of the transceiver, as explained in the Background of the Invention. Link monitor 34 checks for link signals on communication line 14. If link signals are present, monitor 34 generates a LINK_ON signal. If link signals are not present, monitor 34 generates a LINK_OFF signal.

Figure 2:
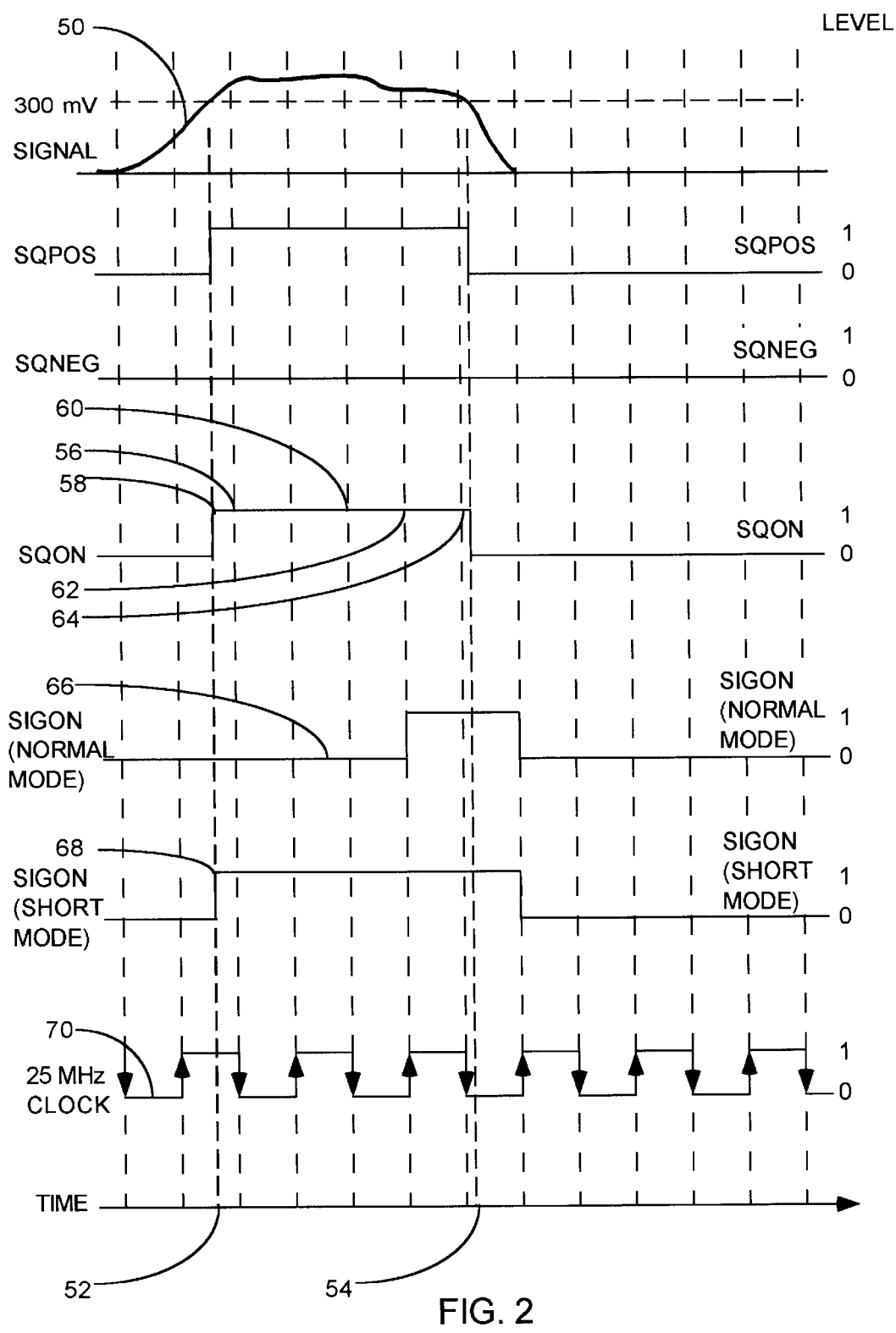
FIG. 2 is a schematic timing diagram showing relationships of signals generated in the transceiver of FIG. 1, in accordance with a preferred embodiment of the present invention.

FIG. 2 is a schematic timing diagram showing relationships of signals generated in system 10, in accordance with a preferred embodiment of the present invention. Squelch circuit 16 outputs a digital signal SQPOS at a level 1, on a first output line 18, when the differential voltage on communication line 14 exceeds a first preset value, which is most preferably equal to about 300 mV. When the differential voltage on communication line 14 is less than a second preset value, circuit 16 outputs a digital signal SQNEG at a level 1, on a second output line 20, most preferably equal to about −300 mV. Preferably, the voltages are measured by positive and negative comparators respectively.

Signals SQPOS and SQNEG are input to an OR gate 22, which outputs a signal SQON. Thus, SQON is set at level 1 when the absolute value of the voltage detected on the communication line exceeds 300 mV. As shown in FIG. 2, when a signal 50 on communication line 14 exceeds 300 mV, at a time 52, SQPOS goes to level 1, and remains at level 1 until a time 54, when signal 50 becomes less than 300 mV. Output SQON of OR gate 22 is consequently at level 1 for substantially the same time interval as SQPOS is at level 1.

Signal SQON is input to a digital filter 24, wherein the length of signal SQON is checked, in order to substantially eliminate spurious detection of noise as a valid signal, and in order to make a preliminary determination whether the signal is a Link Pulse (Normal or Fast), 10BASE-T signal, or a 100BASE-TX MLT-3 signal. Filter 24 checks the length of signal SQON using a clock, most preferably a 25 MHz clock, and operates in one of two modes. In a first mode, herein termed a normal mode, filter 24 samples SQON most preferably at 20 ns intervals, corresponding to half of a clock period. In a second mode, herein termed a short mode, filter 24 samples SQON asynchronously. In the event that SQON is valid, signal SIGON is set at level 1 and is output from filter 24. Most preferably, filter 24 uses a two flip-flop shift register to sample SQON on both edges (normal mode) or asynchronously (short mode). Thus, when filter 24 operates in the normal mode, signal SIGON may be set to level 1 when signal SQON has a width larger than 20 ns, and will always be set to level 1 when signal SQON has a width larger than 40 ns. When filter 24 operates in the short mode, signal SIGON may be set to level 1 when signal SQON has a width larger than the minimum required to set the flip-flop. In this case SIGON stays high for at least one clock cycle.

As shown in FIG. 2, a normal mode SIGON signal 66 is set to level 1 from a time 62 when filter 24, operating on rising edges of a clock 70, finds that SQON is at level 1 at times 58 and 62. Alternatively, a short mode SIGON signal 68 is set to level 1 from a time 58 when filter 24, operating asynchronously, finds that SQON is at level 1 at time 58.

Returning to FIG. 1, a signal validation state machine 26 receives the SIGON signals, and generates a "SIGNAL_VALID" signal, which may be at level 0 or level 1. As described in detail hereinbelow, machine 26 outputs SIGNAL_VALID at level 1 on receipt of two SIGON signals whose leading edges are separated in time by a predetermined interval, dependent on the communication standard being used by transceiver 12. Most preferably, when transceiver 12 operates according to the Ethernet 10BASE-T or 100BASE-TX standard, machine 26 outputs SIGNAL_VALID at level 1 when the two SIGON signals are no more than 64 ms apart (so as to be able to detect two link pulses) and no less than 1 μs apart (so as to be able to filter out double pulses caused, for example, by a large overshoot on communication line 14 of a single link pulse). Thus a valid IDLE signal of 100BASE-TX, a normal Link pulse, and a fast Link pulse stream will be detected and recognized as valid signals. It will be appreciated that the limits of 1 μs and 64 ms refer to communication systems utilizing the 10BASE-T and 100BASE-TX standards, and that other limits, which will be clear to those skilled in the art, will apply to other standards. The SIGNAL_VALID signal is output to an energy-on signal generator 28.

Figure 3:
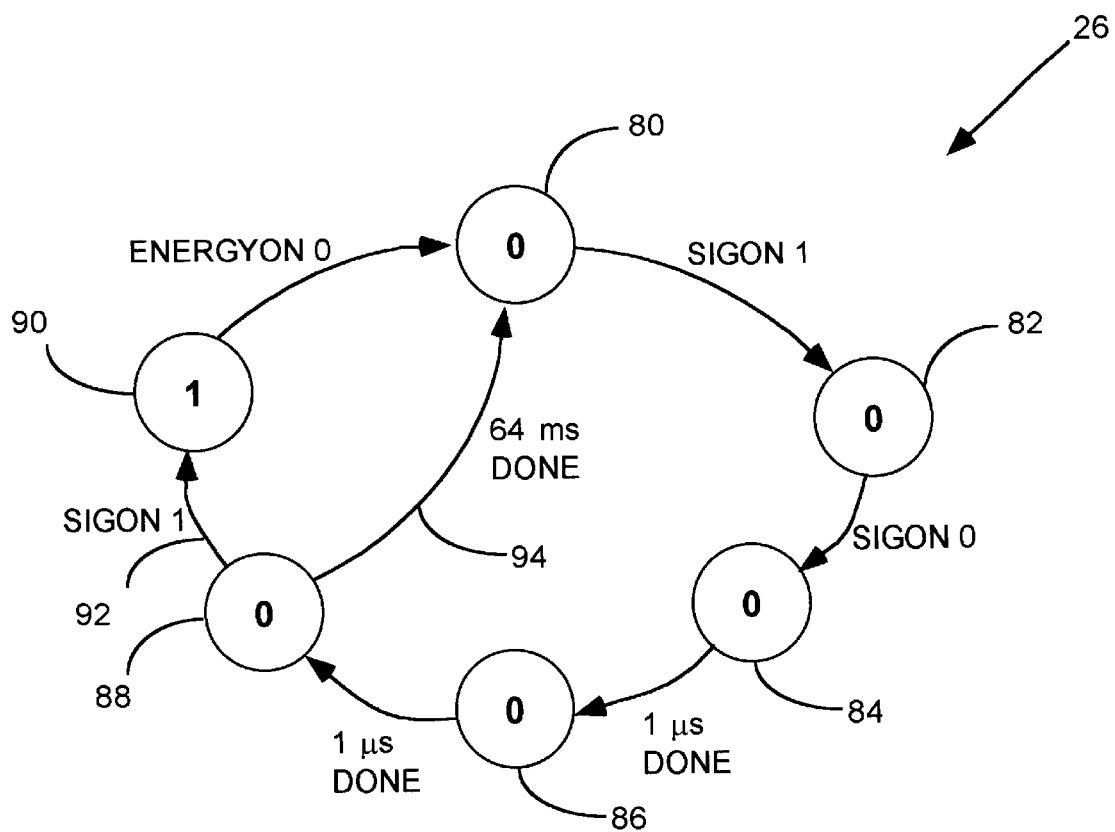
FIG. 3 is a schematic state diagram of the operation of a signal validation state machine, in accordance with a preferred embodiment of the present invention.

FIG. 3 is a schematic diagram of the operation of signal validation state machine 26, in accordance with a preferred embodiment of the present invention. State machine 26 makes transitions among a plurality of states 80, 82, 84, 86, 88, and 90, and most preferably utilizes a clock providing 1 μs pulses in determining when to transit between states. Until receipt of an initial SIGON signal 66 or 68 from filter 24, machine 26 is in state 80, in which SIGNAL_VALID is held at level 0. On receipt of the rising edge of signal SIGON, machine 26 transits to state 82. Machine 26 remains in state 82 until receipt of the falling edge of signal SIGON, whereupon machine 26 transits to state 84. From state 84, machine 26 transits to state 86 on receipt of a first 1 μs clock pulse, and to state 88 on receipt of a second 1 μs clock pulse. In all of these states, SIGNAL_VALID remains at level 0.

In state 88 machine 26 initializes a timer. If machine 26 remains in state 88 for the duration of a predetermined timer period, preferably about 64 ms, without receiving a second SIGON signal, machine 26 transits on a path 94 back to state 80. If machine 26 receives a second SIGON signal before 64 ms have passed, machine 26 transits on a path 92 to state 90, wherein SIGNAL_VALID is set to level 1, and remains therein until machine 26 receives a signal from energy-on signal generator 28, whose operation is described in detail below.

Figure 4:
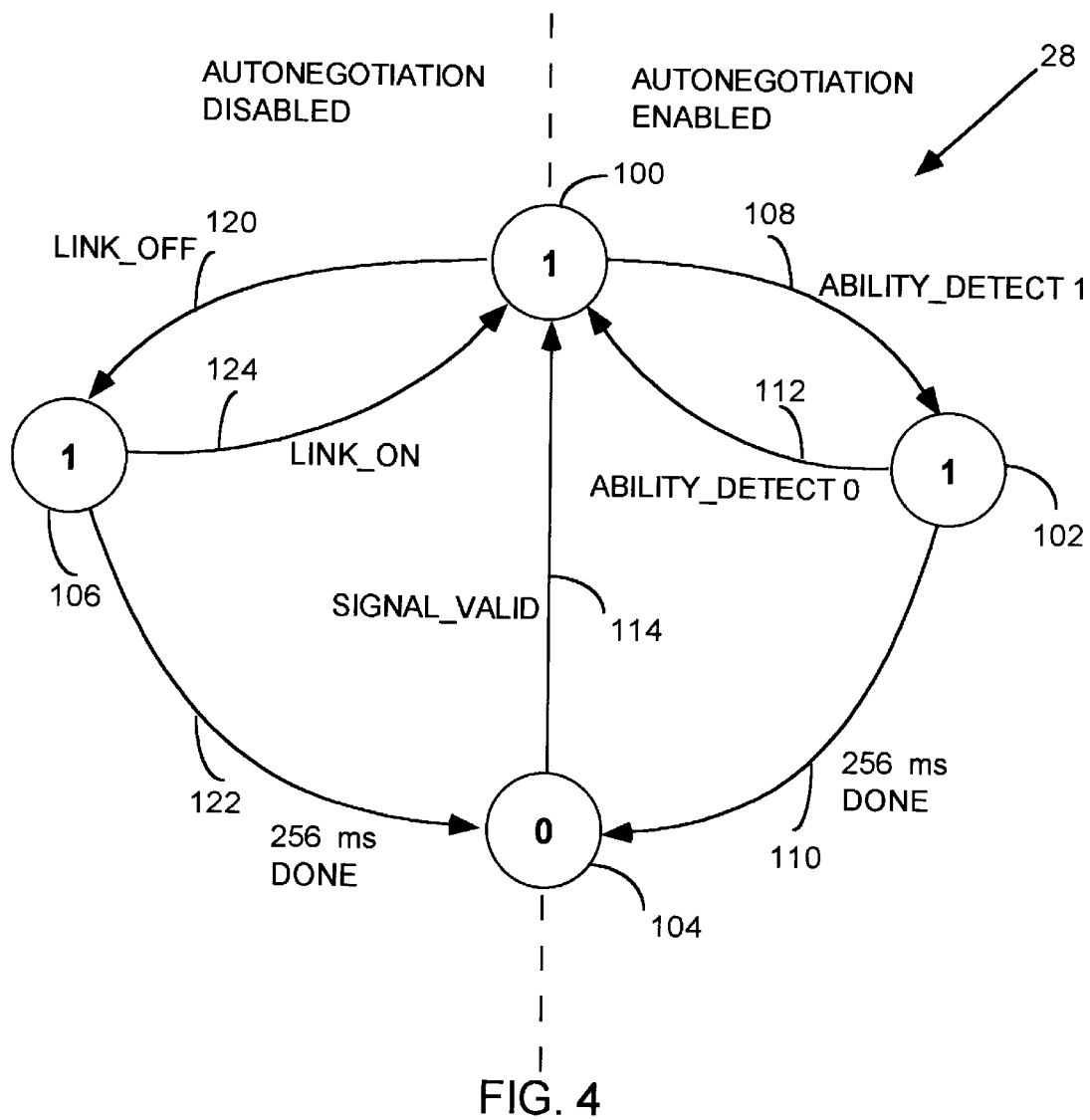
FIG. 4 is a schematic state diagram of the operation of an energy-on generator, in accordance with a preferred embodiment of the present invention.

FIG. 4 is a schematic diagram illustrating the operation of energy-on generator 28, in accordance with a preferred embodiment of the present invention. Generator 28 operates as a state machine which is able to make transitions among a plurality of states 100, 102, 104, and 106, in order to generate a signal ENERGYON. The operation of generator 28 depends on the state of autonegotiation mechanism 36 (FIG. 1), as described hereinbelow.

Beginning in state 100, generator 28 checks the status of autonegotiation mechanism 36. If the mechanism is enabled and has entered an ABILITY_DETECT state (FIG. 1), energy-on generator 28 transits from state 100, wherein signal ENERGYON is held at level 1, to state 102 (ENERGYON still at level 1), along a path 108. In state 102 a timer of 256 ms duration commences. If, after 256 ms, autonegotiation mechanism 36 is still in the ABILITY_DETECT state, generator 28 transits on a path 110 to state 104, wherein ENERGYON is set to level 0. If, during the 256 ms, autonegotiation mechanism 36 transfers out of the ABILITY_DETECT state, the timer is aborted, and generator 26 returns to state 100, on a path 112.

If autonegotiation mechanism 36 is disabled and the energy-on generator has received a LINK_OFF signal from link monitor 34 (FIG. 1), generator 28 transits from state 100 along a path 120 to state 106, wherein signal ENERGYON is held at level 1. In state 106 a timer of 256 ms duration commences. If, during the 256 ms timing, generator 28 receives a LINK_ON signal from monitor 34, the timer is aborted, and generator 28 returns to state 100 along a path 124. Otherwise, after 256 ms, generator 28 transits to state 104.

The transition of ENERGYON from level 1 to level 0, on path 110 or path 122, is received by state machine 26 (FIG. 3) as a signal to transit out of state 90, as described hereinabove. Once in state 104, generator 28 remains in the state until the generator receives a SIGNAL_VALID signal at level 1 from state machine 26, in which case generator 28 returns to state 100 on a path 114. The ENERGYON signal is transferred to power module 30 (FIG. 1). When the ENERGYON signal is at level 1, module 30 supplies power to transceiver circuitry 32. When the ENERGYON signal is at level 0, module 30 powers-down circuitry 32.

The use of state machines 26 and 28 in system 10 enables functions and decisions, generally related to timing of signals, to be made independent of signals and components external to the machines, other than those signals and components utilized by the machines themselves. Thus, most of the remainder of device 12 may be powered up or down while the state machines continue in operation. These state machines, together with digital filter 24, enable the system to quickly and reliably detect signals conveyed to device 12, as well as the absence of such signals, so as to provide both fast response to the signals and reduced power consumption by the device.

It will be appreciated that a signal may be evaluated at more than two points in time to make an initial determination of the validity of the signal as a valid communication pulse. It will also be appreciated that time intervals between more than two valid communication pulses may be evaluated to determine if the pulses represent communication signals. All such evaluations, and their use in determining whether signals are communication signals, are considered to be within the scope of the present invention.

It will be further appreciated that the preferred embodiment described above is cited by way of example, and the full scope of the invention is limited only by the claims.

What is claimed is:

1. A method for switching power to transceiver circuitry coupled to a communication line, comprising:
   receiving a signal from the line;
   comparing, in a digital filter, a time length of a first pulse in the signal having a first level, determined at a first transition of a clock signal, which first level exceeds a predetermined value, against a predetermined signal time length to identify a first valid pulse;
   comparing, in the digital filter, the time length of a second pulse in the signal having a second level, determined at a second transition of the clock signal, which second level exceeds the predetermined value, against the predetermined signal time length to identify a second valid pulse;

utilizing a signal validation state machine to determine whether a time interval between the first and the second valid pulses is within a preset time interval, and if so, to set a signal-valid level to indicate that signal energy is present in the communication line; and utilizing an energy-on generator state machine, responsive to an autonegotiation status of the transceiver circuitry and to the signal-valid level, to switch the power to the transceiver circuitry.

2. A method according to claim 1, wherein receiving the signal comprises selecting a communications standard for use, and wherein the predetermined value is set responsive to the communications standard.

3. A method according to claim 2, wherein selecting the communications standard comprises selecting an Ethernet standard.

4. A method according to claim 2, wherein the predetermined signal time length and the preset time interval are set responsive to the communications standard.

5. A method according to claim 1, wherein the level comprises an absolute value, and wherein the predetermined value comprises a positive value.

6. Apparatus for switching power to transceiver circuitry coupled to a communication line, comprising:

a digital filter which receives a signal from the line and which compares a time length of a first pulse in the signal having a first level, determined at a first transition of a clock signal, which first level is above a predetermined value, against a predetermined signal time length to identify a first valid pulse, and which compares the time length of a second pulse in the signal having a second level, determined at a second transition of the clock signal, which second level is above the predetermined value, against the predetermined signal time length to identify a second valid pulse;

a signal validation state machine which determines whether a time interval between the first and the second valid pulses is within a preset time interval, and if so, sets a signal-valid level to indicate that signal energy is present in the communication line; and an energy-on generator state machine, which, responsive to an autonegotiation mode of the circuitry and to the signal-valid level, switches the power to the circuitry.

7. Apparatus according to claim 6, wherein the signal is transmitted according to a communications standard, and wherein the predetermined value is set responsive to the communications standard.

8. Apparatus according to claim 7, wherein the communications standard comprises an Ethernet standard.

9. Apparatus according to claim 7, wherein the predetermined signal time length and the preset time interval are set responsive to the communications standard.

10. Apparatus according to claim 6, wherein the level comprises an absolute value, and wherein the predetermined value comprises a positive value, and wherein the digital filter comprises a plurality of voltage comparators comparing the absolute value to the positive value.

* * * * *